(12) United States Patent
Song

(10) Patent No.: US 12,306,499 B2
(45) Date of Patent: May 20, 2025

(54) DISPLAY DEVICE

(71) Applicant: LG ELECTRONICS INC., Seoul (KR)

(72) Inventor: Woojung Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/689,253

(22) PCT Filed: Sep. 10, 2021

(86) PCT No.: PCT/KR2021/012319
§ 371 (c)(1),
(2) Date: Mar. 5, 2024

(87) PCT Pub. No.: WO2023/033221
PCT Pub. Date: Mar. 9, 2023

(65) Prior Publication Data
US 2024/0385479 A1    Nov. 21, 2024

(30) Foreign Application Priority Data
Sep. 6, 2021   (KR) .................. 10-2021-0118535

(51) Int. Cl.
*G02F 1/1335* (2006.01)
*G02F 1/13357* (2006.01)
*H05K 9/00* (2006.01)

(52) U.S. Cl.
CPC .. *G02F 1/133608* (2013.01); *G02F 1/133612* (2021.01); *H05K 9/0084* (2013.01)

(58) Field of Classification Search
CPC ........ G02F 1/133608; G02F 1/133612; H05K 9/0084
See application file for complete search history.

(56) References Cited

U.S. PATENT DOCUMENTS

2021/0286415 A1* 9/2021 Kim .................. G06F 1/181
2023/0065839 A1* 3/2023 Kim .................. H02M 1/42

FOREIGN PATENT DOCUMENTS

| KR | 10-2012-0070228 A | 6/2012 |
| KR | 10-2017-0033198 A | 3/2017 |
| KR | 10-2017-0082037 A | 7/2017 |
| KR | 10-2018-0056096 A | 5/2018 |
| KR | 10-2018-0071826 A | 6/2018 |

* cited by examiner

*Primary Examiner* — Anne M Hines
(74) *Attorney, Agent, or Firm* — Birch, Stewart, Kolasch & Birch, LLP

(57) ABSTRACT

A display device is disclosed. The display device may include: a display panel; a frame which is located behind the display panel and to which the display panel is coupled; a back cover covering a rear of the frame; a power supply board located between the frame and the back cover and coupled to the frame; a line filter including an inductor and coupled to a rear surface of the power supply board; a housing which provides an internal space where the inductor is located and which is coupled to the power supply board; and a rear core made of a ferrite material coupled to a rear surface of the housing, wherein the rear core may overlap at least a portion of the inductor in a front-rear direction.

14 Claims, 17 Drawing Sheets

[FIG. 1]
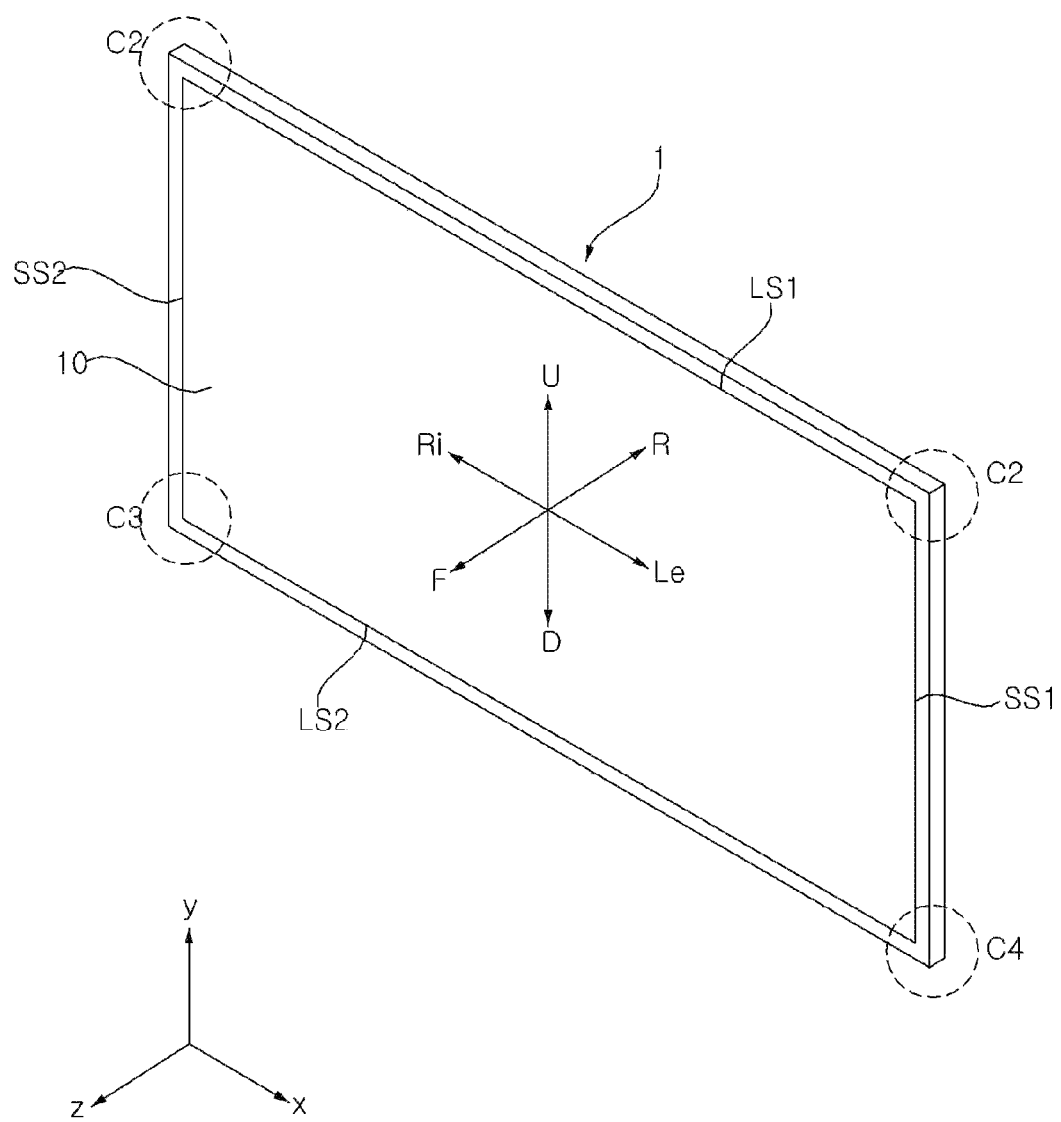

[FIG. 2]
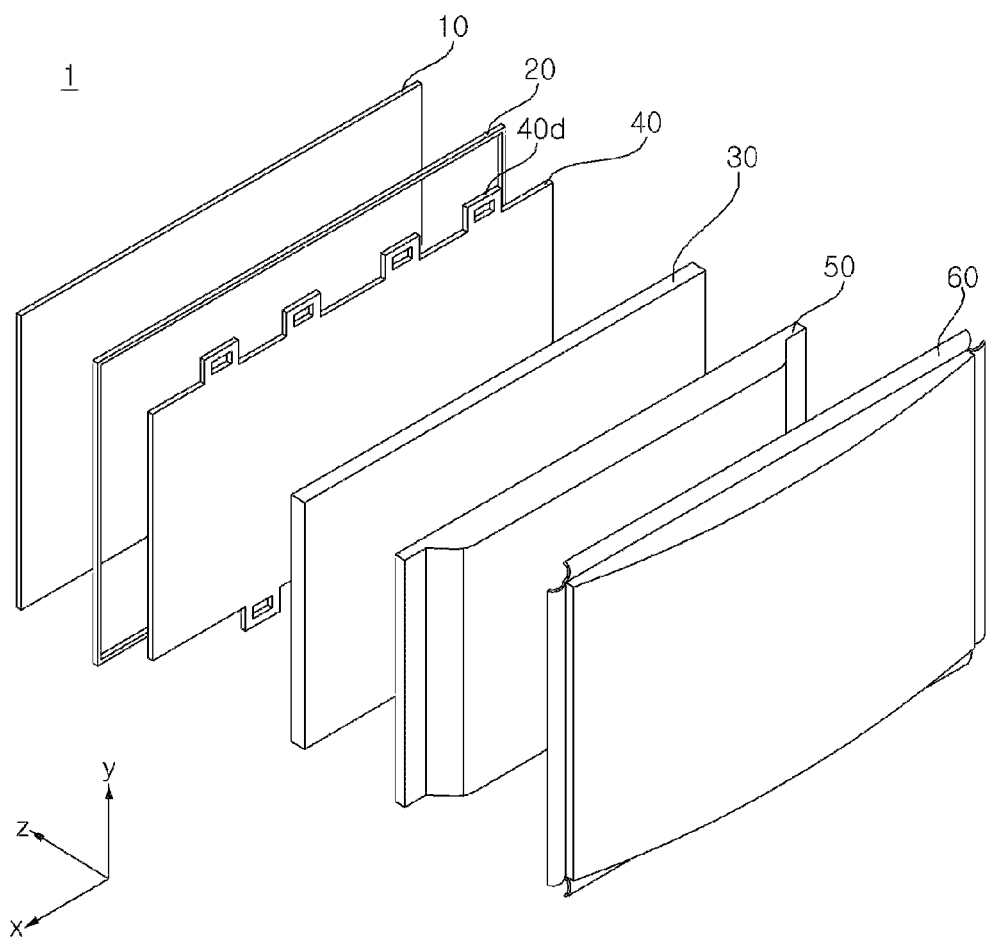

[FIG. 3]
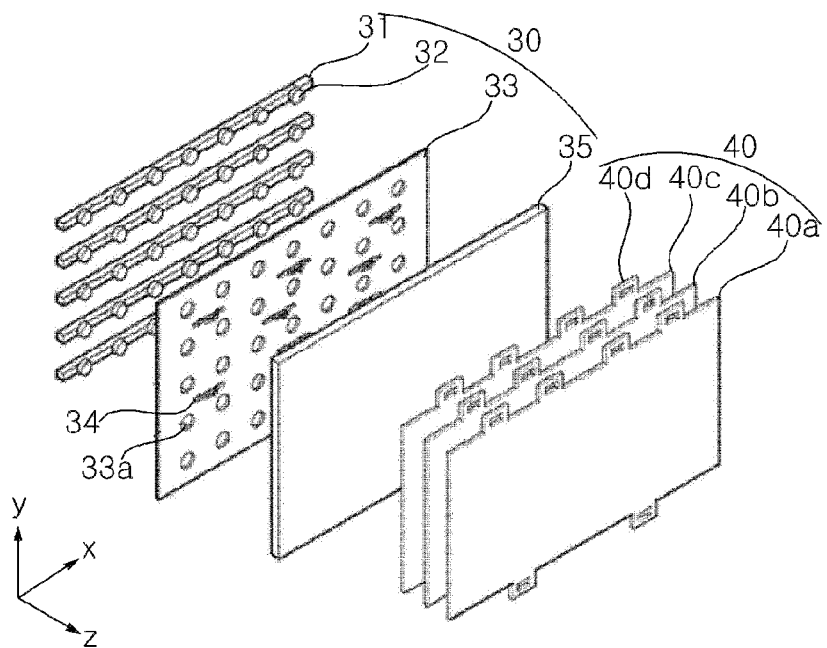

[FIG. 4]
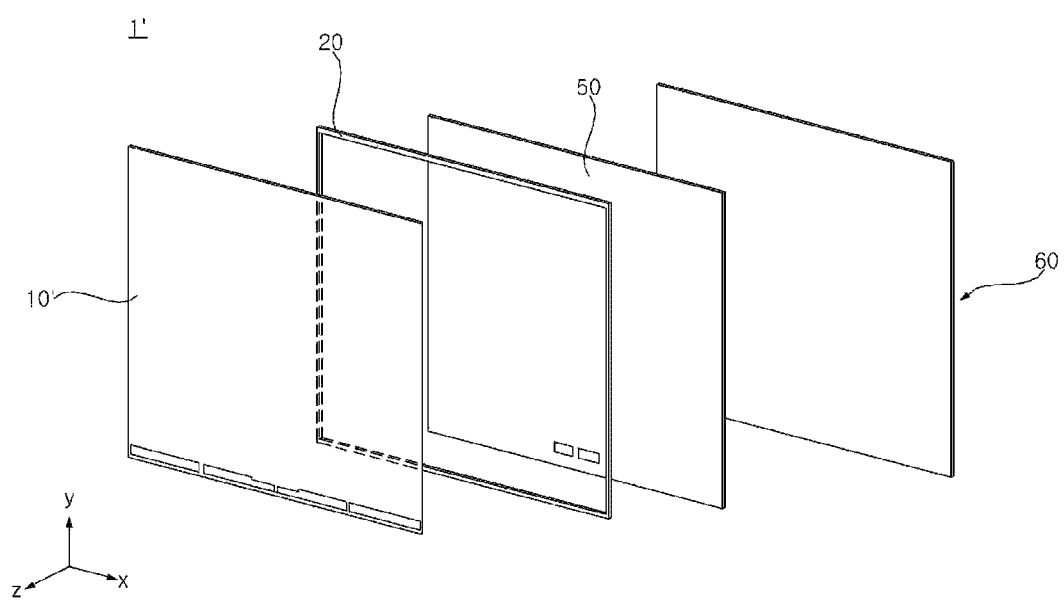

[FIG. 5]
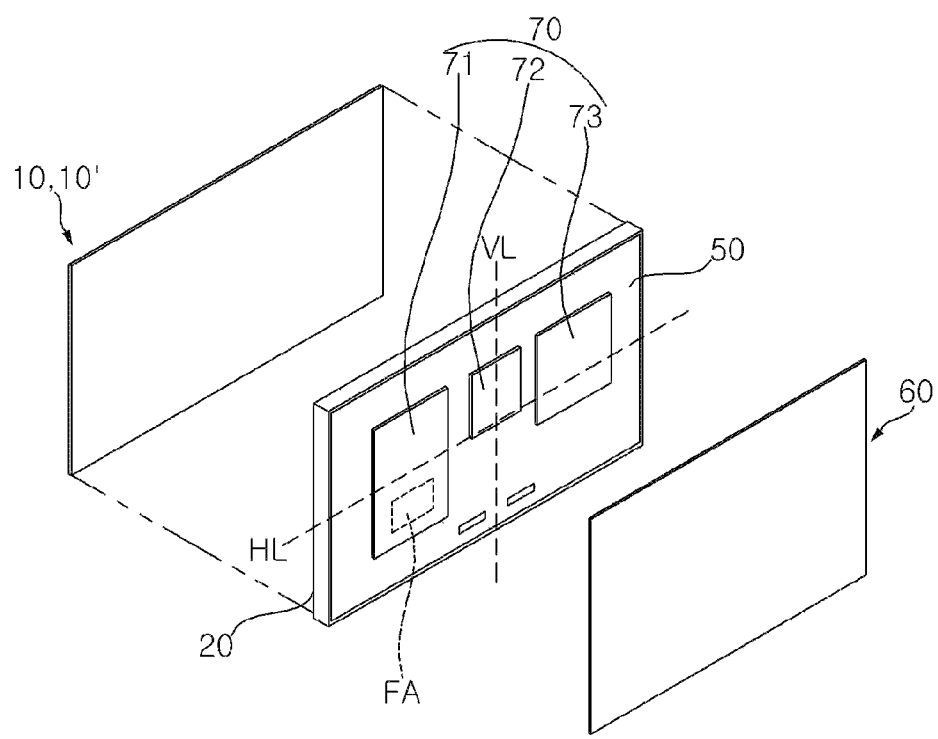

[FIG. 6]
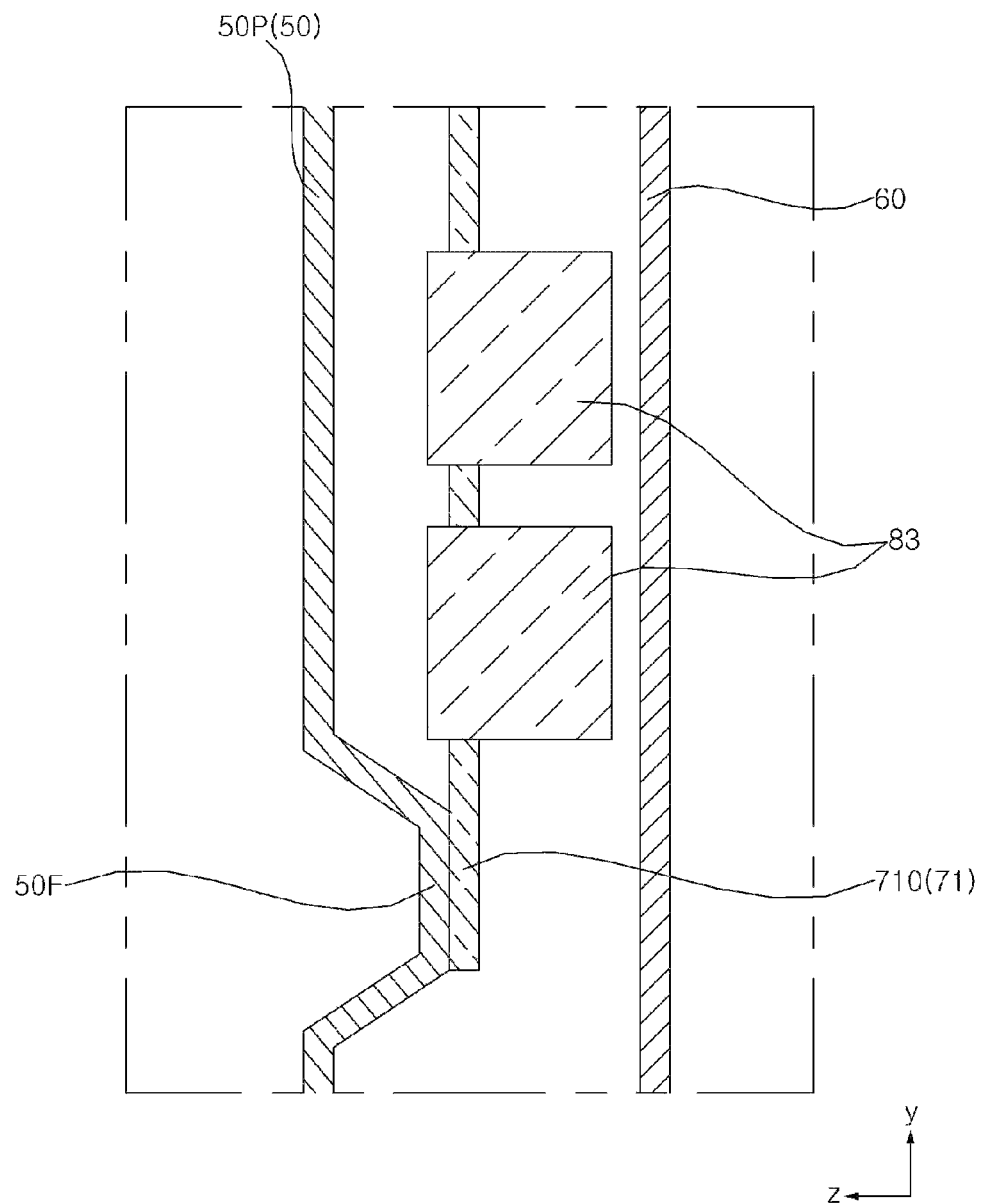

[FIG. 7]
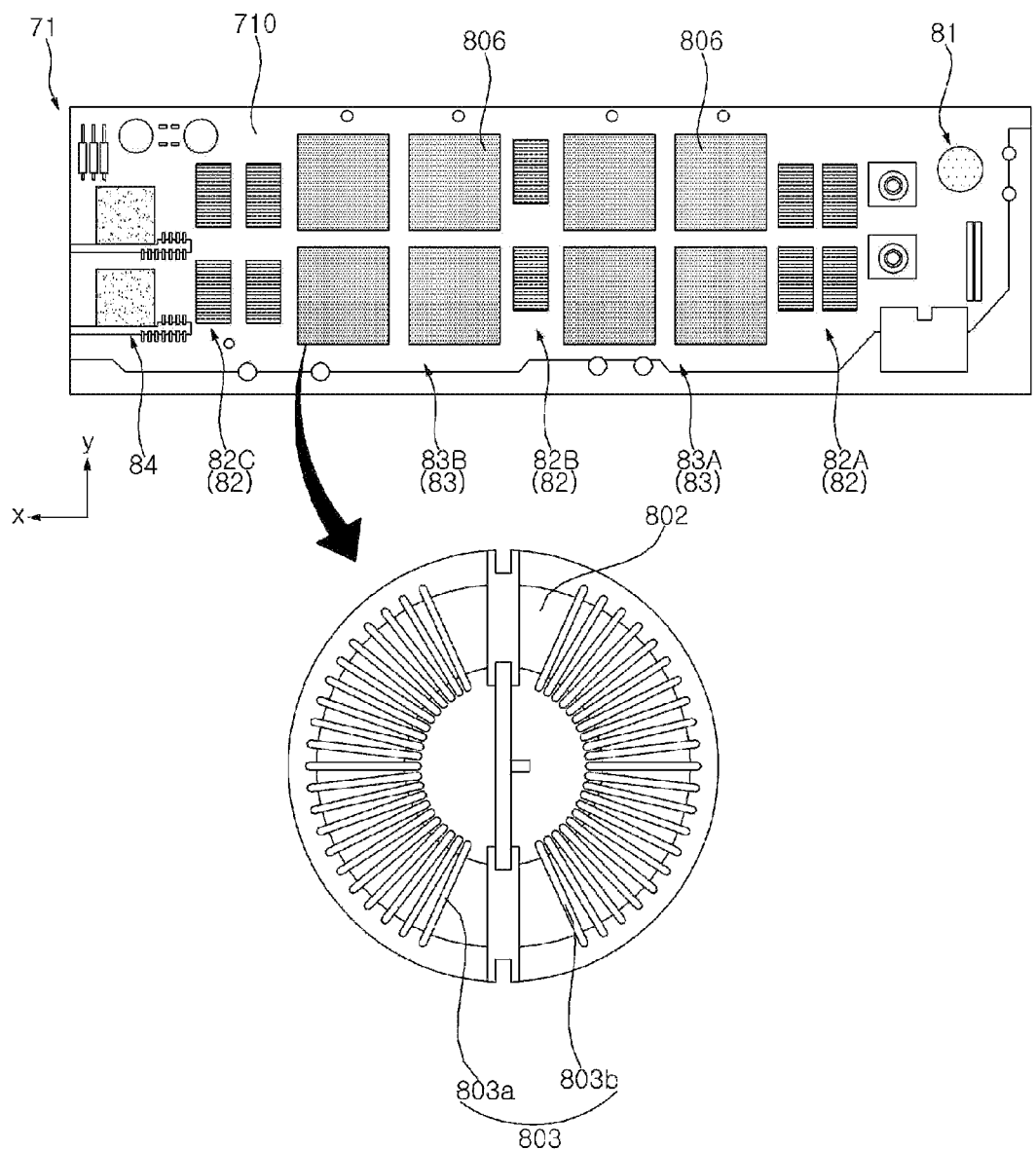

[FIG. 8]
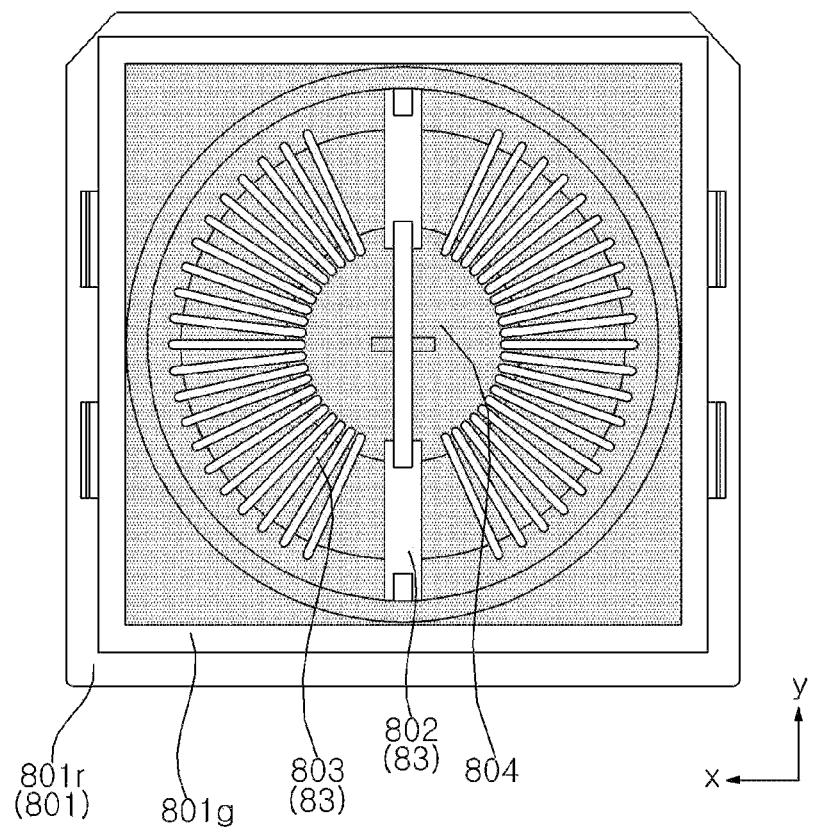

[FIG. 9]
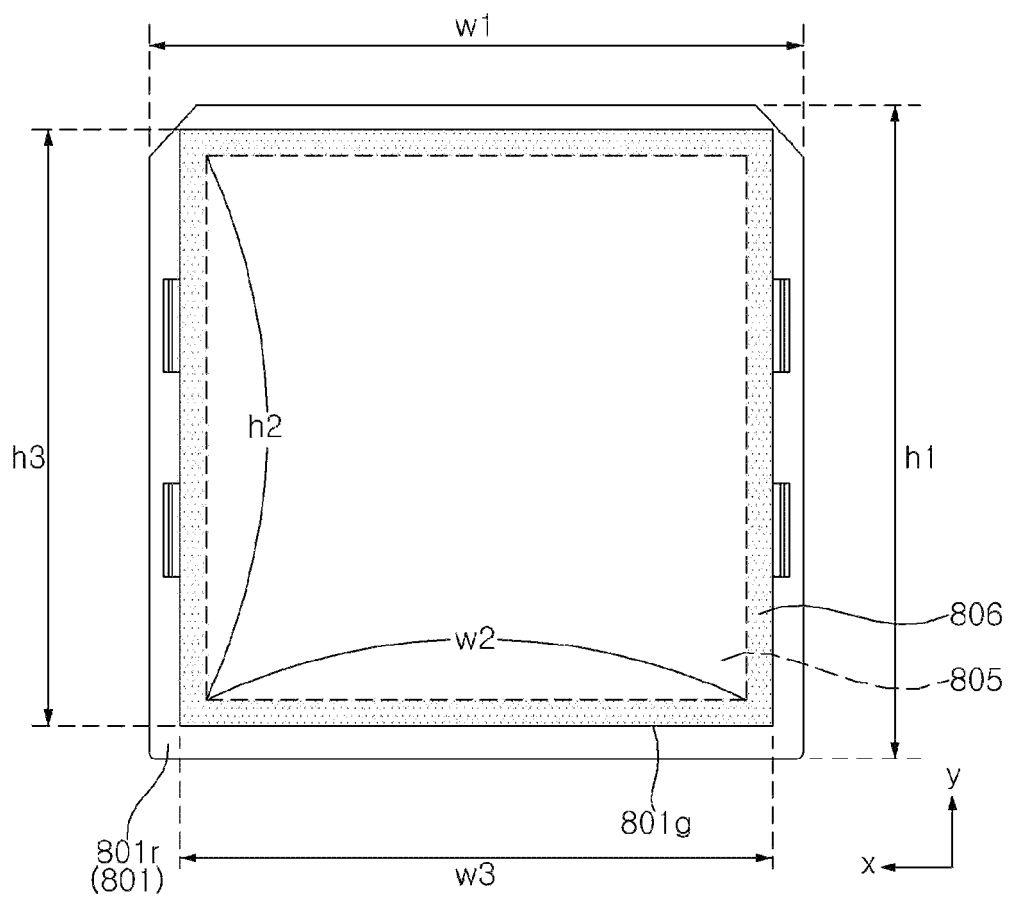

[FIG. 10]
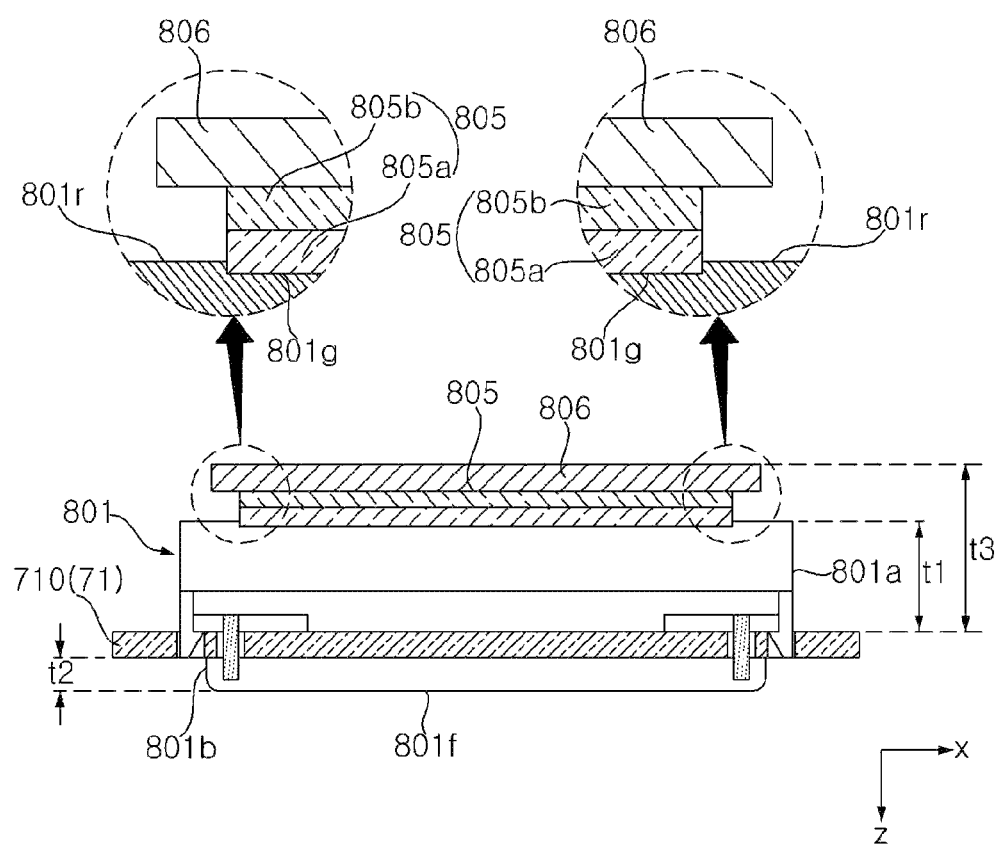

[FIG. 11]
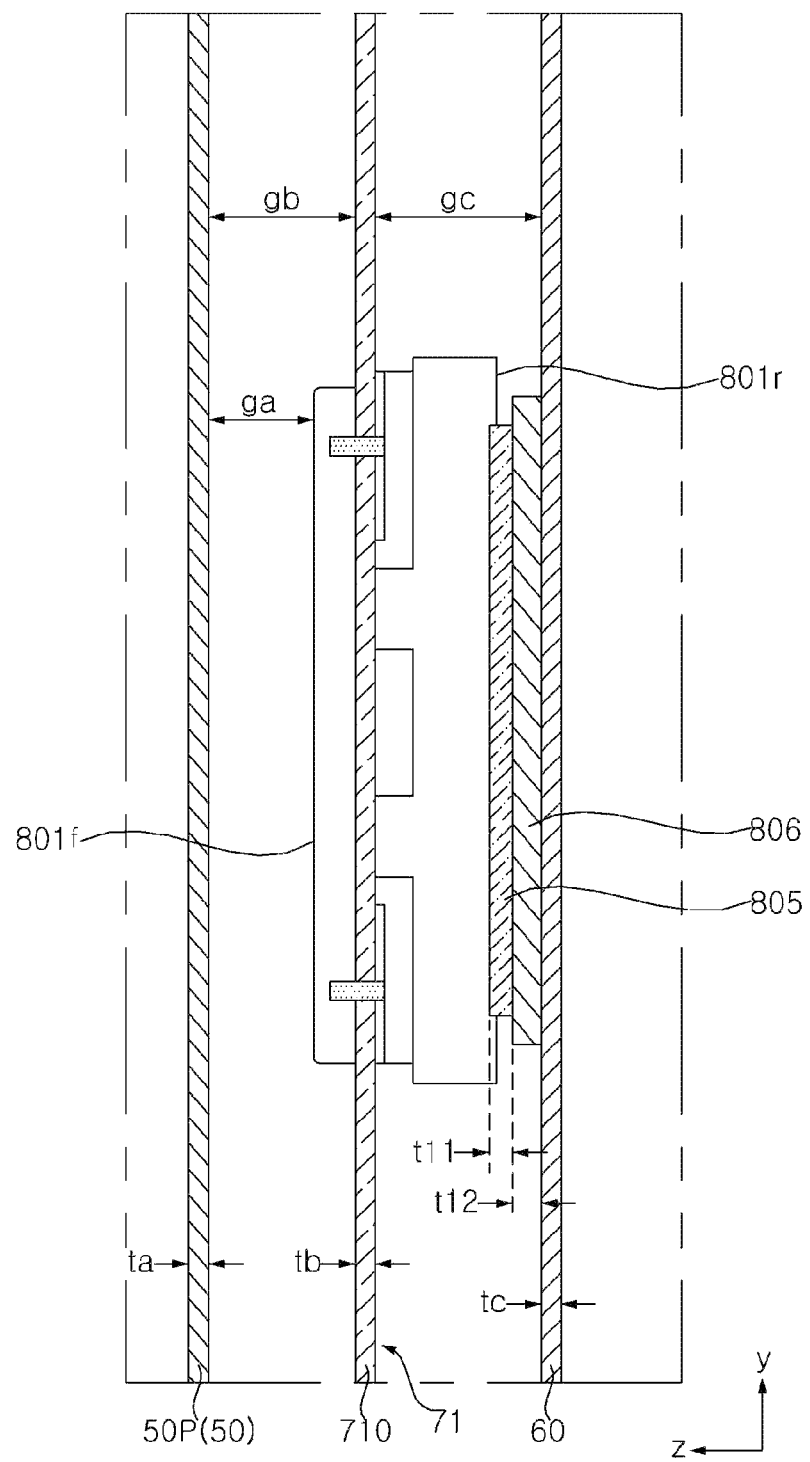

[FIG. 12]
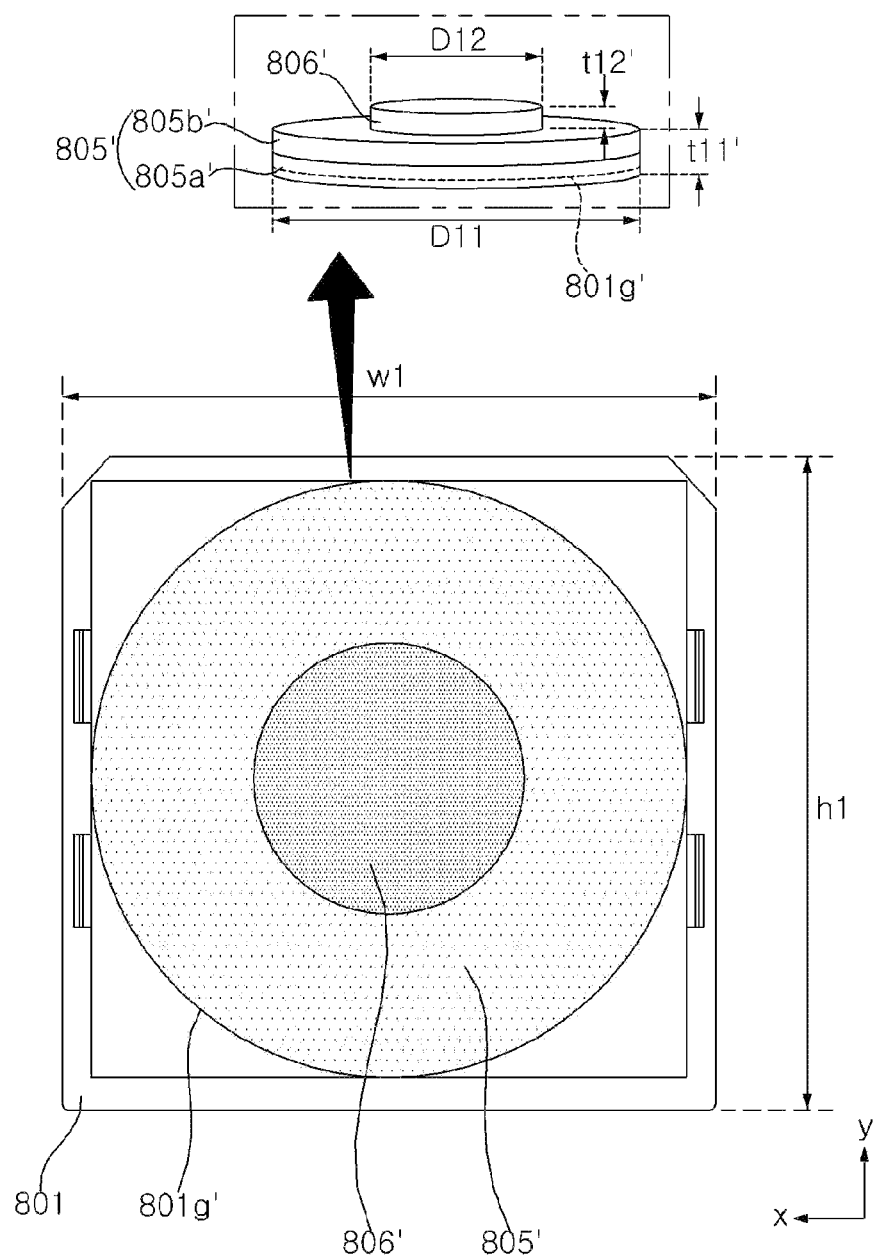

[FIG. 13]
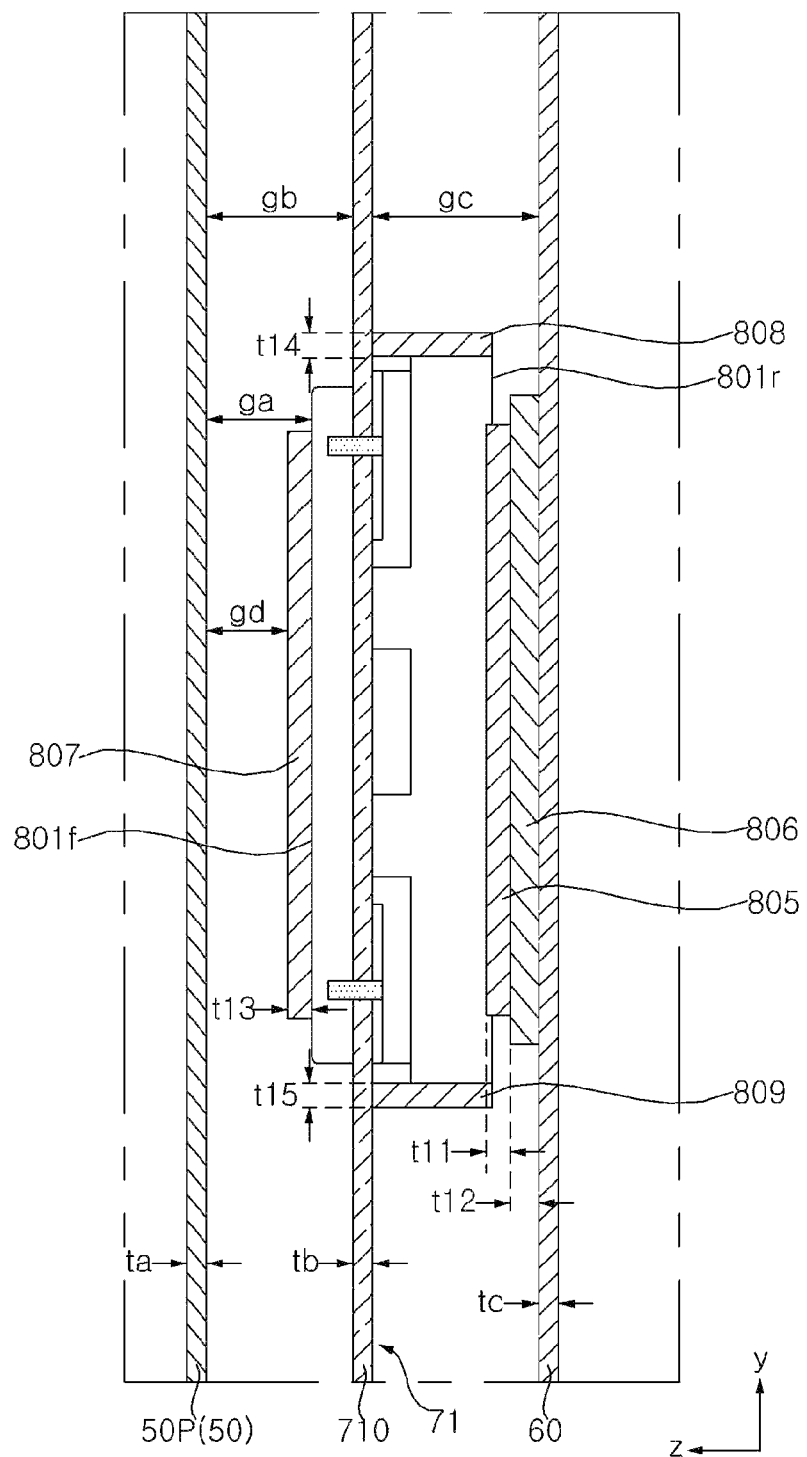

[FIG. 14]
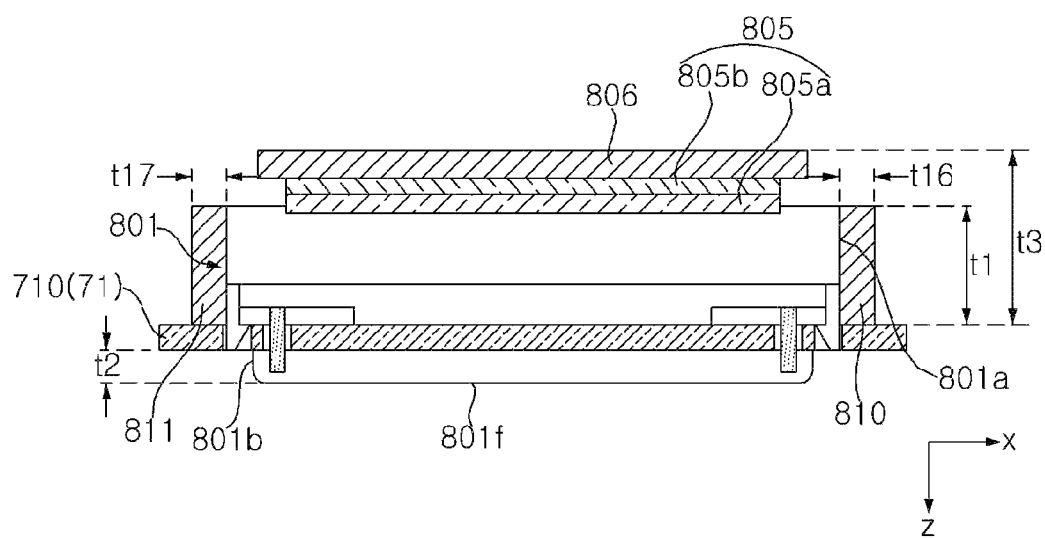

[FIG. 15]
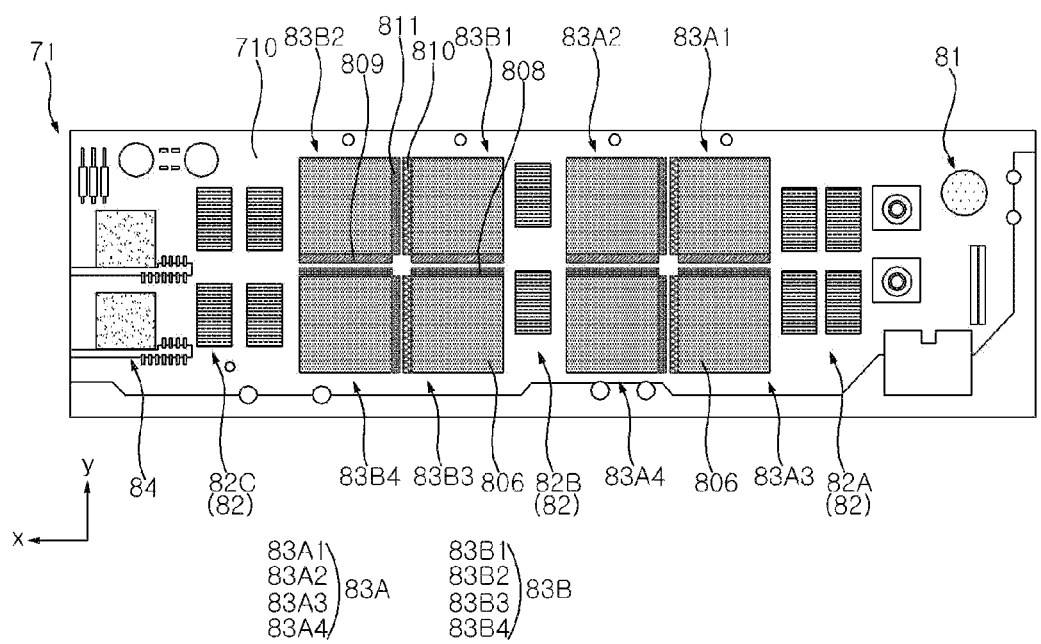

[FIG. 16]
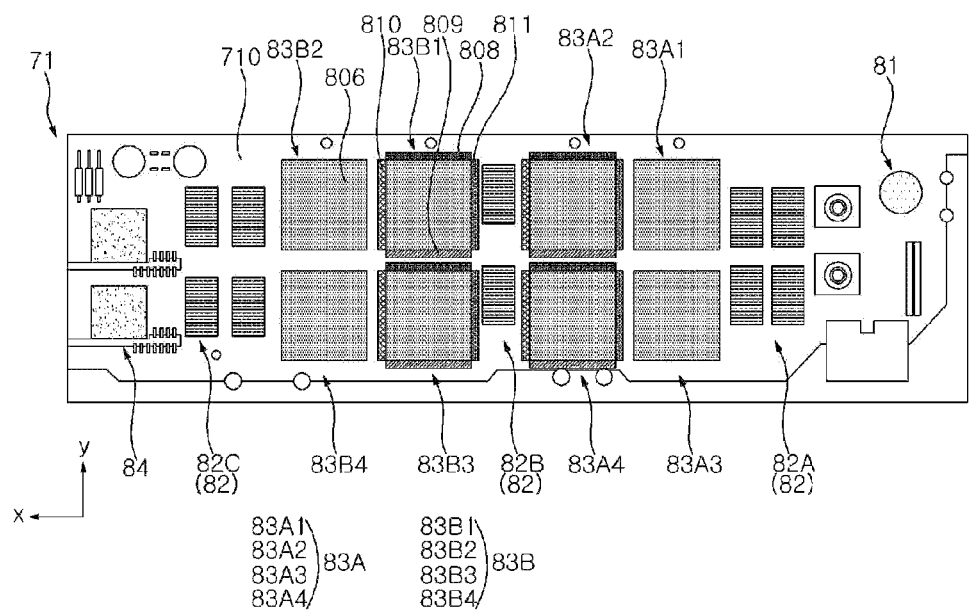

[FIG. 17]
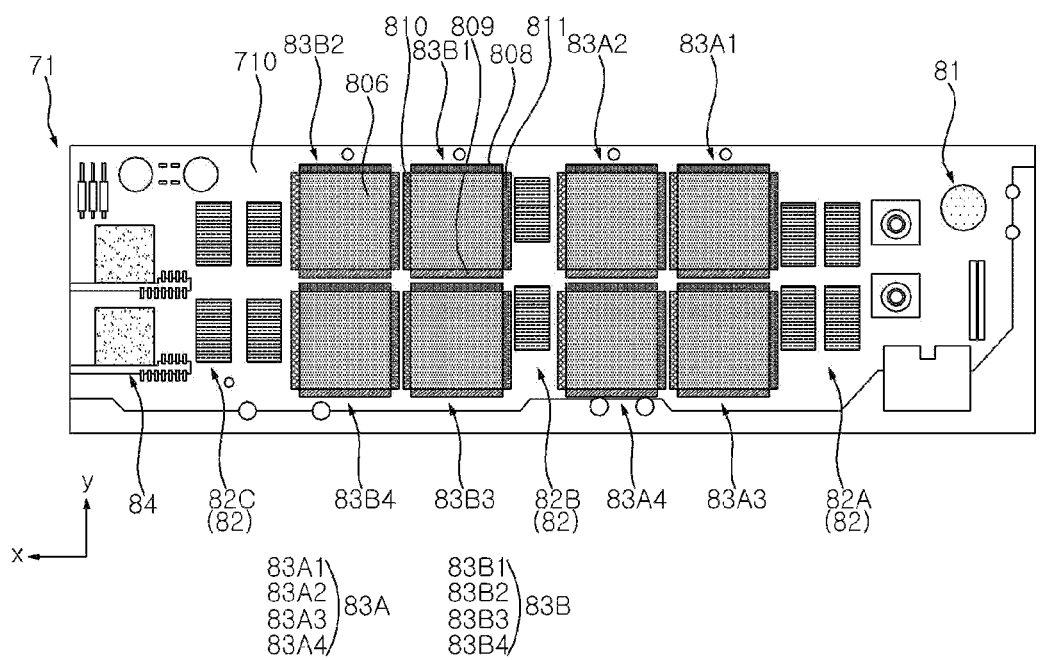

DISPLAY DEVICE

CROSS REFERENCE TO RELATED APPLICATIONS

This application is the National Phase of PCT International Application No. PCT/KR2021/012319, filed on Sep. 10, 2021, which claims priority under 35 U.S.C. 119(a) to Patent Application No. 10-2021-0118535, filed in Republic of Korea on Sep. 6, 2021, all of which are hereby expressly incorporated by reference into the present application.

TECHNICAL FIELD

The present disclosure relates to a display device. More specifically, the present disclosure relates to a display device including a line filter.

BACKGROUND ART

As the information society develops, the demand for display devices is increasing in various forms, and in response to this, various display devices such as LCD (Liquid Crystal Display Device), ELD (Electro luminescent display), VFD (Vacuum Fluorescent Display), OLED (Organic Light Emitting Diodes), and micro LED have been researched and used in recent years.

Among these, an LCD panel includes a TFT substrate and a color substrate facing each other with a liquid crystal layer interposed therebetween, and can display an image using light provided from a backlight unit. In addition, an OLED panel can display an image by depositing an organic material layer capable of emitting light on its own on a substrate on which a transparent electrode is formed. In particular, a display device with OLED panels requires no backlight unit and can be realized in an ultra-thin form.

Recently, much research has been conducted on structures that can effectively reduce vibration and noise of metal parts generated when a large-screen ultra-thin display device displays high-definition images.

DETAILED DESCRIPTION OF INVENTION

Technical Problems

An objective of the present disclosure is to solve the above-described problems and other problems.

Another objective may be to provide a display device capable of shielding electromagnetic fields leaking from a line filter of a power supply board.

Another objective may be to provide a core made of a material that can effectively shield electromagnetic fields leaking from the line filter.

Another objective may be to provide various examples of the arrangement of the core for a plurality of inductors.

Another objective may be to provide a structure that can ensure the flatness of the core for the inductor.

Another objective may be to provide a structure that can improve the stability and convenience of coupling the core to the inductor.

Technical Solution

In accordance with an aspect of the present disclosure to achieve the above or other objectives, a display device may include: a display panel; a frame which is located behind the display panel and to which the display panel is coupled; a back cover covering a rear of the frame; a power supply board located between the frame and the back cover and coupled to the frame; a line filter including an inductor and coupled to a rear surface of the power supply board; a housing which provides an internal space where the inductor is located and which is coupled to the power supply board; and a rear core made of a ferrite material coupled to a rear surface of the housing, wherein the rear core may overlap at least a portion of the inductor in a front-rear direction.

Effect of Invention

The effects of the display device according to the present disclosure are as follows.

According to at least one of embodiments of the present disclosure, it is possible to provide the display device capable of shielding electromagnetic fields leaking from the line filter of the power supply board.

According to at least one of embodiments of the present disclosure, it is possible to provide the core made of a material that can effectively shield electromagnetic fields leaking from the line filter.

According to at least one of embodiments of the present disclosure, it is possible to provide various examples of the arrangement of the core for a plurality of inductors.

According to at least one of embodiments of the present disclosure, it is possible to provide a structure that can ensure the flatness of the core for the inductor.

According to at least one of embodiments of the present disclosure, it is possible to provide a structure that can improve the stability and convenience of coupling the core to the inductor.

Additional scope of applicability of the present disclosure will become apparent from the following detailed description. However, since various changes and modifications within the idea and scope of the present disclosure will be apparent to those skilled in the art, the detailed description and specific embodiments such as preferred embodiments of the present disclosure should be understood as being given only as examples.

BRIEF DESCRIPTION OF THE DRAWING

FIGS. 1 to 17 are view showing examples of a display device according to embodiments of the present disclosure.

MODE FOR CARRYING OUT THE INVENTION

Hereinafter, embodiments disclosed in the present specification will be described in detail with reference to the accompanying drawings, wherein identical or similar components are assigned the same reference numerals regardless of the drawing numbers, and redundant descriptions thereof will be omitted. (Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.)

The suffixes "module" and "unit" for components used in the following description are given or used interchangeably merely to facilitate description of the specification, and do not have distinct meanings or functions in themselves. (In general, suffixes such as "module" and "unit" may be used to refer to elements or components. Use of such suffixes herein is merely intended to facilitate description of the specification, and the suffixes do not have any special meaning or function.)

Further, in describing the embodiments disclosed in the present specification, if it is determined that detailed descriptions of related known technologies may obscure the gist of the embodiments disclosed in the present specification, the detailed descriptions will be omitted. In addition, the accompanying drawings are only for easy understanding of the embodiments disclosed in the present specification, and it should be understood that the technical idea disclosed in the present specification is not limited by the accompanying drawings, and includes all modifications, equivalents, and substitutes included in the idea and technical scope of the present disclosure. (In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.)

The terms including ordinal numbers, such as first, second, etc., may be used to describe various components, but the components are not limited by the terms. These terms are used only for the purpose of distinguishing one component from another. (It will be understood that although the terms first, second, etc. may be used herein to describe various elements, these elements should not be limited by these terms. These terms are only used to distinguish one element from another.)

When it is described that a component is "coupled" or "connected" to another component, it should be understood that it may be directly coupled to or connected to another component, but that other components may exist therebetween. On the other hand, when it is described that a component is "directly coupled" or "directly connected" to another component, it should be understood that there are no other components therebetween. (It will be understood that when an element is referred to as being "connected with" another element, there may be intervening elements present. In contrast, it will be understood that when an element is referred to as being "directly connected with" another element, there are no intervening elements present.)

A singular expression includes a plural expression unless context clearly indicates otherwise. (A singular representation may include a plural representation unless context clearly indicates otherwise.)

In the present specification, it should be understood that the terms such as "include or comprise," "have," or the like are intended to designate the presence of features, numbers, steps, operations, components, parts, or combinations thereof described in the specification, but are not intended to exclude in advance the possibility of the existence or addition of one or more other features, numbers, steps, operations, components, parts, or combinations thereof. (In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.)

The direction indications of up (U), down (D), left (Le), right (Ri), front (F), and rear (R) shown in the drawings are only for convenience of explanation, and the technical idea disclosed in the present specification is not limited thereby.

Referring to FIG. 1, a display device 1 may include a display panel 10. The display panel 10 may display a screen.

The display device 1 has a first long side LS1, a second long side LS2 opposite to the first long side LS1, a first long side LS1 adjacent to the first long side LS1 and the second long side LS2, and a second short side SS2 opposite to the first short side SS1. Meanwhile, for convenience of explanation, a length of the long sides LS1, LS2 is shown and described as being larger than a length of the short sides SS1, SS2, but a case where the length of the long sides LS1, LS2 is approximately equal to the length of the short sides SS1, SS2 may also be possible.

The direction parallel to the long sides LS1, LS2 of the display device 1 may be referred to as a left-right direction. The direction parallel to the short sides SS1, SS2 of the display device 1 may be referred to as an up-down direction. The direction perpendicular to the long sides LS1, LS2 and the short sides SS1, SS2 of the display device 1 may be referred to as a front-rear direction.

The direction in which the display panel 10 displays images may be referred to as a forward direction F, z, and the opposite direction thereto may be referred to as a rearward direction R. The direction to the first long side LS1 may be referred to as an upper side U, y. The direction to the second long side LS2 may be referred to as a lower side D. The direction to first short side SS1 may be referred to as a left side Le, x. The direction to second short side SS2 may be referred to as a right side Ri.

The first long side LS1, the second long side LS2, the first short side SS1, and the second short side SS2 may be referred to as edges of the display device 1. In addition, the point where the first long side LS1, the second long side LS2, the first short side SS1, and the second short side SS2 meet each other may be called a corner.

For example, the point where the first short side SS1 and the first long side LS1 meet may be referred to as a first corner C1. The point where the first long side LS1 and the second short side SS2 meet may be referred to as a second corner C2. The point where the second short side SS2 and the second long side LS2 meet may be referred to as a third corner C3. The point where the second long side LS2 and the first short side SS1 meet may be referred to as a fourth corner C4.

Referring to FIG. 2, the display device 1 may include the display panel 10, a guide panel 20, backlight units 30, 40, a frame 50, and a back cover 60.

The display panel 10 may form a front surface of the display device 1 and may display images. The display panel 10 may display an image by having a plurality of pixels output RGB (Red, Green or Blue) for each pixel in a timed manner. The display panel 10 may be divided into an active area where an image is displayed and a de-active area where no image is displayed. The display panel 10 may include a front substrate and a rear substrate facing each other with a liquid crystal layer interposed therebetween. The display panel 10 may be referred to as an LCD panel.

The front substrate may include a plurality of pixels comprised of red, green, and blue sub-pixels. The front substrate may output light corresponding to the color of red, green, or blue according to a control signal.

The rear substrate may include switching elements. The rear substrate may switch pixel electrodes. For example, the pixel electrode may change the molecular arrangement of the liquid crystal layer according to an externally input control signal. The liquid crystal layer may include liquid crystal molecules. The arrangement of liquid crystal molecules may change in response to a voltage difference generated between the pixel electrode and a common electrode. The liquid crystal layer may transmit light provided from the backlight units 30, 40 to the front substrate or block it.

The guide panel 20 may surround the periphery of the display panel 10 and cover the side of the display panel 10. The guide panel 20 may be coupled to the display panel 10 or may support the display panel 10. The guide panel 20 may be referred to as a side frame or middle cabinet.

The backlight units 30, 40 may be located behind the display panel 10. The backlight units 30, 40 may include light sources. The backlight units 30, 40 may be coupled to the frame 50 in front of the frame 50. The backlight units 30, 40 may be driven by a full driving method or a partial driving method such as local dimming or impulsive driving. The backlight units 30, 40 may include an optical sheet 40 and an optical layer 30.

The optical sheet 40 may evenly transmit light from the light source to the display panel 10. The optical sheet 40 may be comprised of a plurality of layers. For example, the optical sheet 40 may include a prism sheet, a diffusion sheet, or the like. Meanwhile, a coupling portion 40d of the optical sheet 40 may be coupled to the frame 50 and/or the back cover 60.

The frame 50 may be located behind the backlight units 30, 40 and may support components of the display device 1. The edge of the frame 50 may be fixed to the guide panel 20. For example, the components, such as backlight units 30, 40 and a printed circuit board (PCB) on which a plurality of electronic devices are located, may be coupled to the frame 50. For example, the frame 50 may include a metal material. Frame 50 may be referred to as a main frame, module cover, or cover bottom.

The back cover 60 may cover the rear of the frame 50. The back cover 60 may be coupled to the frame 50. For example, the back cover 60 may include a metal material.

Referring to FIG. 3, the optical layer 30 may include a substrate 31, at least one optical assembly 32, a reflective sheet 33, and a diffusion plate 35. The optical sheet 40 may be located in front of the optical layer 30.

The substrate 31 may be provided in the form of a plurality of straps extending in the left-right direction and spaced apart from each other in the up-down direction. At least one optical assembly 32 may be mounted on the substrate 31. An electrode pattern is formed on the substrate 31 to connect an adapter and the optical assembly 32. For example, the electrode pattern may be a carbon nanotube electrode pattern. The substrate 31 may be made of at least one of polyethylene terephthalate (PET), glass, polycarbonate (PC), and silicon. The substrate 31 may be a printed circuit board (PCB) on which at least one optical assembly 32 is mounted.

The optical assembly 32 may be a light emitting diode (LED) chip or a light emitting diode package including at least one light emitting diode chip. The light assembly 32 may be comprised of a colored LED that emits at least one color among colors such as red, green, and blue or a white LED. The colored LED may include at least one of a red LED, a green LED, and a blue LED.

The reflective sheet 33 may be located in front of the substrate 31. At least one hole 33a may be formed through the reflective sheet 33, and the optical assembly 32 may be located in the hole 33a. The reflective sheet 33 may reflect light provided from the optical assembly 32 or reflected from the diffusion plate 35 forward. For example, the reflective sheet 33 may include a metal and/or metal oxide having a high reflectivity, such as at least one of aluminum (Al), silver (Ag), gold (Au), and titanium dioxide ($TiO_2$).

In addition, an air gap may be formed between the reflective sheet 33 and the diffusion plate 35. The air gap functions as a buffer, and the light provided from the optical assembly 32 can be spread widely by the air gap. Supporters 34 may be located between the reflective sheet 33 and the diffusion plate 35 and may form the air gap.

The diffusion plate 35 may be located in front of the reflective sheet 33. The diffusion plate 35 may be located between the reflective sheet 33 and the optical sheet 40.

The optical sheet 40 may include at least one sheet. For example, the optical sheet 40 may include one or more prism sheets and/or one or more diffusion sheets. A plurality of sheets of the optical sheet 40 may be adhered to or in close contact with each other.

Specifically, the optical sheet 40 may be comprised of a plurality of sheets with different functions. For example, the optical sheet 40 may include a first optical sheet 40a, a second optical sheet 40b, and a third optical sheet 40c. For example, the first optical sheet 40a may be a diffusion sheet, and the second optical sheet 40b and the third optical sheet 40c may be prism sheets. The diffusion sheet prevents the light coming from the diffusion plate 35 from being partially concentrated, thereby making the distribution of light more uniform. The prism sheet concentrates the light coming from the diffusion plate 35 and provides it to the display panel 10. Meanwhile, the number and/or location of the diffusion sheet and the prism sheet may be varied.

Referring to FIG. 4, a display device 1' may include a display panel 10', a guide panel 20, a frame 50, and a back cover 60.

The display panel 10' may form the front surface of the display device 1' and may display an image. The display panel 10' may divide an image into a plurality of pixels and output an image with color, brightness, and saturation for each pixel. The display panel 10' may be divided into an active area where an image is displayed and a de-active area where no image is displayed. The display panel 10' may generate light corresponding to the color of red, green, or blue depending on a control signal. The display panel 10' may be referred to as an OLED panel.

The guide panel 20' may surround the periphery of the display panel 10' and cover the side of the display panel 10'. The guide panel 20' may be coupled to the display panel 10' or may support the display panel 10'. The guide panel 20' may be referred to as a side frame or middle cabinet.

The frame 50 may be located behind the display panel 10', and the display panel 10' may be coupled thereto. The edge of the frame 50 may be fixed to the guide panel 20. Electronic components may be mounted on the frame 50. For example, the frame 50 may include a metal material. The frame 50 may be referred to as a main frame, module cover, or cover bottom.

The back cover 60 may cover the rear of the frame 50. The back cover 60 may be coupled to the frame 50. For example, the back cover 60 may include a metal material.

Referring to FIG. 5, boards 70 may be coupled to the frame 50 at the rear of the frame 50. The board 70 may include a plurality of electronic devices. The board 70 may be a printed circuit board (PCB) and may be electrically connected to the electronic components of the display device.

The boards 70 may include a power supply board 71 that provides power to each component of the display device, a timing controller board 72 that provides video signals to the display panels 10, 10', and a main board 73 that controls the display device.

For example, the power supply board 71 may be adjacent to the left side of the frame 50, and the main board 73 may be adjacent to the right side of the frame 50. In this case, the timing controller board 72 may be located between the power supply board 71 and the main board 73.

Referring to FIGS. 6 and 7, the power supply board 71 may be fixed to the frame 50 between the frame 50 and the back cover 60. For example, a press portion 50P may be formed by pressing the frame 50 from the rear of the frame 50 to the front, and may face the power supply board 71. For example, a fixing part 50F may protrude rearward from the press part 50P, and a substrate 710 of the power supply board 71 may be fixed thereto.

Line filters 82, 83 may be mounted on the substrate 710. The line filters 82, 83 may be electrically connected to the power supply board 71. The line filters 82, 83 can remove noise at the power frequency applied to the power supply board 71. The line filters 82, 83 may be referred to as EMI filters (Electro Magnetic Interference filters). A fuse 81 and a high-frequency filter 84 may be spaced apart from each other with the line filters 82, 83 therebetween, and may be mounted on the substrate 710. The line filters 82, 83 may include a capacitor 82 and an inductor 83 that are electrically connected to each other.

In this case, the inductor 83 may include a bobbin 802 and a wire 803 wound around the bobbin 802 in a coil shape. The bobbin 802 may include a plastic material. The wire 803 may include a copper (Cu) material and allow current to flow therethrough. The wire 803 may include a first wire 803a wound around one side of the bobbin 802 and a second wire 803b wound around the other side of the bobbin 802. The end of the first wire 803a may be connected to the live side, and the end of the second wire 803b may be connected to the neutral side. For example, the wire 803 wound around the bobbin 802 may be referred to as a coil 803 or a toroidal coil.

In addition, a center core (not shown) made of a ferrite material may be inserted into the bobbin 802. The center core can shield the electromagnetic field formed by the flow of current passing through the wire 803.

For example, the capacitor 82 may include a first capacitor 82A, a second capacitor 82B, and a third capacitor 82C. The first capacitor 82A may be adjacent to the fuse 81 and may be mounted on the substrate 710. For example, the number of first capacitors 82A may be four. The third capacitor 82C may be adjacent to the high-frequency filter 84 and may be mounted on the substrate 710. For example, the number of third capacitors 82C may be four. The second capacitor 82B may be located between the first capacitor 82A and the third capacitor 82C and may be mounted on the substrate 710. For example, the number of second capacitors 82B may be two. Meanwhile, the capacitor 82 may be an X-Capacitor.

For example, the inductor 83 may include a first inductor 83A and a second inductor 83B. The first inductor 83A may be located between the first capacitor 82A and the second capacitor 82B and may be mounted on the substrate 710. For example, the number of first inductors 83A may be four. The second inductor 83B may be located between the second capacitor 82B and the third capacitor 82C and may be mounted on the substrate 710. For example, the number of second inductors 83B may be four.

Referring to FIG. 8, the housing 801 may have an overall box shape. The housing 801 can be opened front and rear. The housing 801 may include a plastic material.

The inductor 83 may be accommodated in an internal space of the housing 801. The bobbin 802 of the inductor 83 may be fixed to the inside of the housing 801. A filler 804 may be filled in the internal space of the housing 801 to surround the inductor 83. For example, the filler 804 may include an epoxy bonding or silicone bonding material. Accordingly, the filler 804 can alleviate the vibration and noise of the coil 803 of the inductor 83.

Referring to FIGS. 9 and 10, a rear core 805 may be coupled to the housing 801 at the rear of the housing 801. The rear core 805 may cover at least a portion of the rear of the inductor 83 (see FIG. 8). That is, in the front-rear direction, the rear core 805 may overlap at least a portion of the inductor 83. For example, the rear core 805 may include a first sheet 805a made of an aluminum material and a second sheet 805b made of a ferrite material. The first sheet 805a and the second sheet 805b may be coupled to each other. The rear core 805 may be referred to as a composite shielding sheet. For another example, the rear core 805 may include a single sheet of a ferrite material.

A groove 801g may be formed to be recessed forward from a rear surface 801r of the housing 801. The groove 801g may be flat. The groove 801g may be located behind the inductor 83 (see FIG. 8) and the filler 804 (see FIG. 8). The groove 801g may extend along the periphery of housing 801. An upper portion of the groove 801g may extend in the left-right direction and may be adjacent to the upper side of the housing 801. A lower portion of the groove 801g may extend in the left-right direction and may be adjacent to the lower side of the housing 801. A left portion of the groove 801g may extend in the up-down direction and may be adjacent to the left side of the housing 801. A right portion of the groove 801g may extend in the up-down direction and may be adjacent to the right side of the housing 801. The opening of the housing 801 described above may be formed through the groove 801g and may communicate with the internal space of the housing 801 where the inductor 83 (see FIG. 8) is located.

The first sheet 805a of the rear core 805 may be seated on the groove 801g and cover the opening. The first sheet 805a may be coupled to the groove 801g through an adhesive member such as double-sided tape. For example, the first sheet 805a may have a square plate shape. A width w2 of the first sheet 805a may be smaller than a width w1 of the housing 801, and a height h2 of the first sheet 805a may be smaller than a height h1 of the housing 801.

The second sheet 805b of the rear core 805 may be positioned on the first sheet 805a. The second sheet 805b may be coupled to the first sheet 805a through an adhesive member such as double-sided tape. For example, the second sheet 805b may have the same shape as the first sheet 805a. That is, a width of the second sheet 805b may be equal to the width w2 of the first sheet 805a, and a height of the second sheet 805b may be equal to the height h2 of the first sheet 805a.

In this case, compared to the case where the rear core 805 is directly coupled to the filler 804 (see FIG. 8), the rear core 805 can be disposed flat on the housing 801. Accordingly, it is possible to prevent noise deviation due to uneven flatness of the rear core 805 with respect to the filler 804.

In addition, at least a portion of a side surface of the rear core 805 may contact a step formed between the rear surface 801r of the housing 801 and the groove 801g. Accordingly, mating convenience and mating stability of the rear core 805 to the housing 801 can be improved. In this case, a distance t3 between the rear surface of the substrate 710 and a rear surface of a gap pad 806, which will be described later, may be smaller than the sum of a thickness t11 (see FIG. 11) of a first part 801a of the housing 801, which will be described later, and a thickness t12 (see FIG. 11) of the gap pad 806. For example, the distance t3 may be about 13.0 mm.

Referring to FIGS. 10 and 11, the back cover 60 made of metal may be located behind the housing 801 and adjacent to the housing 801. The rear core 805 may be located between the housing 801 and the back cover 60 and may cover the rear of the inductor 83 (see FIG. 8) accommodated inside the housing 801.

That is, the rear core 805 can shield the leakage flux of the inductor 83 between the inductor 83 and the back cover 60. Accordingly, the rear core 805 can prevent the formation of an eddy current in the back cover 60 due to the electromagnetic field of the inductor 83 and reduce vibration and noise of the back cover 60.

Further, the thickness t11 of the rear core 805 may be determined based on a maximum value of the current flowing in the power supply board 71, a thickness ta of the frame 50, and/or a thickness tc of the back cover 60. That is, the thickness t11 of the rear core 805 may be proportional to the maximum value of the current flowing in the power supply board 71, and may be inversely proportional to the thickness ta of the frame 50 and the thickness tc of the back cover 60. For example, the thickness ta of the frame 50 and the thickness tc of the back cover 60 may be about 0.8 mm. For example, the thickness t11 of the rear core 805 may be about 2.0 mm.

The gap pad 806 may be located on the second sheet 805b of the rear core 805. The gap pad 806 may be aligned with the rear core 805 in the front-rear direction. The gap pad 806 may be coupled to the second sheet 805b through an adhesive member such as double-sided tape. For example, the gap pad 806 may include a rubber material. For example, the size of the gap pad 806 may be larger than the size of the second sheet 805b. A width w3 of the gap pad 806 may be larger than the width of the second sheet 805b and may be smaller than the width w1 of the housing 801 (see FIG. 9). The height h3 of the gap pad 806 may be greater than the height of the second sheet 805b and smaller than the height h1 of the housing 801 (see FIG. 9). For another example, the size of the gap pad 806 may be equal to or smaller than the size of the second sheet 805b.

Further, the gap pad 806 may contact a front surface of the back cover 60. In other words, the thickness t12 of the gap pad 806 may be substantially equal to the gap between the rear core 805 and the back cover 60. Accordingly, the gap pad 806 can reduce vibration and noise of the back cover 60. For example, the thickness t12 of the gap pad 806 may be about 1.5 to 2.0 mm.

Meanwhile, the housing 801 may be coupled to the substrate 710 of the power supply board 71. The housing 801 may penetrate the substrate 710. The first part 801a of the housing 801 may be located behind the substrate 710 and may form the rear surface 801r of the housing 801. A second part 801b of the housing 801 may be located in front of the substrate 710 and may form a front surface 801f of the housing 801. A third part (not shown) of the housing 801 may be positioned between the first part 801a and the second part 801b and may be inserted into the substrate 710. The first part 801a, the second part 801b, and the third part described above may be formed as one body.

A distance t1 between the rear surface of the substrate 710 and the rear surface 801r of the housing 801 may be a thickness t1 of the first part 801a. A distance t2 between the front surface of the substrate 710 and the front surface 801f of the housing 801 may be a thickness t2 of the second part 801b. The thickness t1 of the first part 801a may be greater than the thickness t2 of the second part 801b. For example, the thickness t1 of the first part 801a may be about 9.2 mm. For example, the thickness t2 of the second part 801b may be about 2.8 mm.

In this case, compared to the case where the housing 801 is located on the rear surface of the substrate 710 without penetrating the substrate 710, a gap gc between the substrate 710 and the back cover 60 can be minimized. That is, arrangement of the housing 801 penetrating the substrate 710 may be advantageous in minimizing the thickness of the display device.

Referring to FIG. 12, a rear core 805' may be coupled to the housing 801 at the rear of the housing 801. The rear core 805' may cover at least a portion of the rear of the inductor 83 (see FIG. 8). That is, in the front-rear direction, the rear core 805' may overlap at least a portion of the inductor 83. For example, the rear core 805' may include a first sheet 805a' made of an aluminum material and a second sheet 805b' made of a ferrite material. The first sheet 805a' and the second sheet 805b' may be coupled to each other. The rear core 805' may be referred to as a composite shielding sheet. For another example, the rear core 805' may include a single sheet of a ferrite material.

A groove 801g' may be formed to be recessed forward from the rear surface 801r of the housing 801. The groove 801g' may be flat. The groove 801g' may be located behind the inductor 83 (see FIG. 8) and the filler 804 (see FIG. 8). The groove 801g' may extend along the coil 803 of the inductor 83 (see FIG. 8). The opening of the housing 801 described above may be formed through the groove 801g' and may communicate with the internal space of the housing 801 where the inductor 83 (see FIG. 8) is located. That is, the groove 801g' may have an overall ring shape.

The first sheet 805a' of the rear core 805' may be seated on the groove 801g' and cover the opening. The first sheet 805a' may be coupled to the groove 801g' through an adhesive member such as double-sided tape. For example, the first sheet 805a' may have a circular plate shape. For another example, the first sheet 805a' may have a ring plate shape. A diameter D11 of the first sheet 805a' may be smaller than the width w1 and the height h1 of the housing 801.

The second sheet 805b' of the rear core 805' may be positioned on the first sheet 805a'. The second sheet 805b' may be coupled to the first sheet 805a' through an adhesive member such as double-sided tape. For example, the second sheet 805b' may have the same shape as the first sheet 805a'. That is, a diameter of the second sheet 805b' may be the same as the diameter of the first sheet 805a'.

In this case, compared to the case where the rear core 805' is directly coupled to the filler 804 (see FIG. 8), the rear core 805' can be disposed flat on the housing 801. Accordingly, it is possible to prevent noise deviation due to uneven flatness of the rear core 805 with respect to the filler 804.

In addition, at least a portion of a side surface of the rear core 805' may contact a step formed between the rear surface 801r of the housing 801 and the groove 801g'. Accordingly, mating convenience and mating stability of the rear core 805 to the housing 801 can be improved.

A gap pad 806' may be located on the second sheet 805b' of the rear core 805'. The gap pad 806' may be aligned with the rear core 805' in the front-rear direction. The gap pad 806' may be coupled to the second sheet 805b' through an adhesive member such as double-sided tape. For example, the gap pad 806' may include a rubber material. The gap pad 806' may have a cylindrical shape. A diameter D12 of the gap pad 806' may be smaller than the diameter of the rear core 805'. For example, the gap pad 806' may be positioned on the disk-shaped first sheet 805a'. For another example, a portion of the gap pad 806' may be inserted into the ring plate-shaped first sheet 805a'.

Referring to FIG. 13, the frame 50 made of metal may be located in front of the housing 801 and adjacent to the housing 801. A gap ga between the front surface 801f of the housing 801 and the frame 50 may be smaller than a gap gb between the front surface of the substrate 710 and the frame 50.

A front core 807 may be located between the housing 801 and the frame 50 and may cover the front of the inductor 83 (see FIG. 8) accommodated inside the housing 801. The front core 807 may be coupled to the front surface 801f of the housing 801 through an adhesive member such as double-sided tape and may be spaced apart from the frame 50. A gap gd between a front surface of the front core 807 and the frame 50 may be smaller than the gap ga between the front face 801f of the housing 801 and the frame 50. For example, the material and thickness t13 of the front core 807 may be substantially the same as the material and thickness t11 of the rear core 805 described above.

That is, the front core 807 can shield the leakage flux of the inductor 83 between the inductor 83 and the frame 50. Accordingly, the front core 807 can prevent the formation of an eddy current in the frame 50 due to the electromagnetic field of the inductor 83 and reduce vibration and noise of the frame 50.

An upper core 808 may be coupled to the upper side of the housing 801 through an adhesive member such as double-sided tape. A lower core 809 may be coupled to the lower side of the housing 801 through an adhesive member such as double-sided tape. The upper core 808 and the lower core 809 may be located at the rear of the substrate 710. For example, the material and thickness t14 of the upper core 807 may be substantially the same as the material and thickness t11 of the rear core 805 described above. For example, the material and thickness t15 of the lower core 808 may be substantially the same as the material and thickness t11 of the rear core 805 described above.

That is, the upper core 808 and the lower core 809 can shield the leakage flux of the inductor 83 toward the upper and lower sides of the housing 801. Accordingly, the upper core 808 and the lower core 809 can prevent the formation of eddy current in the frame 50 and the back cover 60 due to the electromagnetic field of the inductor 83, and the frame 50 and vibration and noise of the back cover 60 can be reduced. The upper core 808 and the lower core 809 may be collectively referred to as vertical cores 808, 809.

Referring to FIG. 14, a left core 810 may be coupled to the left side of the housing 801 through an adhesive member such as double-sided tape. A right core 811 may be coupled to the right side of the housing 801 through an adhesive member such as double-sided tape. The left core 810 and the right core 811 may be located at the rear of the substrate 710. For example, the material and thickness t16 of the left core 810 may be substantially the same as the material and thickness t11 of the rear core 805 described above. For example, the material and thickness t17 of the right core 811 may be substantially the same as the material and thickness t11 of the rear core 805 described above.

That is, the left core 810 and the right core 811 can shield leakage flux of the inductor 83 toward the left and right sides of the housing 801. Accordingly, the left core 810 and the right core 811 can prevent the formation of eddy current in the frame 50 and the back cover 60 due to the electromagnetic field of the inductor 83, and the frame 50 and vibration and noise of the back cover 60 can be reduced. The left core 810 and the right core 811 may be collectively referred to as horizontal cores 810, 811.

Referring to FIG. 15, the first inductor 83A may include a plurality of first inductors 83A1, 83A2, 83A3, 83A4 that are spaced apart from each other. The first-1 inductor 83A1 and the first-2 inductor 83A2 may be spaced apart from each other in the left-right direction. The first-3 inductor 83A3 and the first-4 inductor 83A4 may be spaced apart from each other in the left-right direction. The first-1 inductor 83A1 and the first-2 inductor 83A2 may be spaced upward from the first-3 inductor 83A3 and the first-4 inductor 83A4.

For example, the vertical cores 808, 809 and the horizontal cores 810, 811 may be
located between the plurality of first inductors 83A1, 83A2, 83A3, 83A4. Specifically, the left core 810 and the lower core 809 may be coupled to the left and lower sides of the housing 801 accommodating the first-1 inductor 83A1, respectively. The right core 811 and the lower core 809 may be coupled to each of the right and lower sides of the housing 801 accommodating the first-2 inductor 83A2, respectively. The left core 810 and the upper core 808 may be coupled to the left side and the upper side of the housing 801 accommodating the first-3 inductor 83A3, respectively. The right core 811 and the upper core 808 may be coupled to the right side and the upper side of the housing 801 accommodating the first-4 inductor 83A4, respectively.

Accordingly, the vertical cores 808, 809 and the horizontal cores 810, 811 can shield leakage flux spreading between the plurality of first inductors 83A1, 83A2, 83A3, 83A4.

The second inductor 83B may include a plurality of second inductors 83B1, 83B2, 83B3, 83B4 spaced apart from each other. The second-1 inductor 83B1 and the second-2 inductor 83B2 may be spaced apart from each other in the left-right direction. The second-3 inductor 83B3 and the second-4 inductor 83B4 may be spaced apart from each other in the left-right direction. The second-1 inductor 83B1 and the second-2 inductor 83B2 may be spaced upward from the second-3 inductor 83B3 and the second-4 inductor 83B4.

For example, the vertical cores 808, 809 and the horizontal cores 810, 811 may be located between the plurality of second inductors 83B1, 83B2, 83B3, 83B4. Specifically, the left core 810 and the lower core 809 may be coupled to the left and lower sides of the housing 801 accommodating the second-1 inductor 83B1, respectively. The right core 811 and the lower core 809 may be coupled to the right and lower sides of the housing 801 accommodating the second-2 inductor 83A2, respectively. The left core 810 and the upper core 808 may be coupled to the left side and the upper side of the housing 801 accommodating the second-3 inductor 83B3, respectively. The right core 811 and the upper core 808 may be coupled to the right side and the upper side of the housing 801 accommodating the second-4 inductor 83B4, respectively.

Accordingly, the vertical cores 808, 809 and the horizontal cores 810, 811 can shield leakage flux between the plurality of second inductors 83B1, 83B2, 83B3, 83B4.

Referring to FIG. 16, first center inductors 83A2, 83A4, which are part of the plurality of first inductors 83A1, 83A2, 83A3, 83A4, may be adjacent to the plurality of second inductors 83B1, 83B2, 83B3, 83B4. The first center inductors 83A2, 83A4 may be the first-2 inductor 83A2 and the first-4 inductor 83A4.

The vertical cores 808, 809 and the horizontal cores 810, 811 may surround the sides of each of the first center inductors 83A2, 83A4. Specifically, the upper core 808, the lower core 809, the left core 810, and the right core 811 may be respectively coupled to the upper, lower, left and right sides of the housing 801 accommodating the first-2 inductor 83A2. Further, the upper core 808, the lower core 809, the left core 810, and the right core 811 may be respectively coupled to the upper, lower, left, and right sides of the housing 801 accommodating the first-4 inductor 83A4.

Second center inductors 83B1, 83B3, which are part of the plurality of second inductors 83B1, 83B2, 83B3, 83B4, may be adjacent to the plurality of first inductors 83A1, 83A2, 83A3, 83A4. The second center inductors 83B1, 83B3 may be the second-1 inductor 83B1 and the second-3 inductor 83B3.

The vertical cores 808, 809 and the horizontal cores 810, 811 may surround the sides of each of the second center inductors 83B1, 83B3. Specifically, the upper core 808, the lower core 809, the left core 810, and the right core 811 may be respectively coupled to the upper, lower, left and right sides of the housing 801 accommodating the second-1 inductor 83B1. Further, the upper core 808, the lower core 809, the left core 810, and the right core 811 may be respectively coupled to the upper, lower, left, and right side of can be combined with each of the right sides of the housing 801 accommodating the second-3 inductor 83B3.

The first center inductors 83A2, 83A4 and the second center inductors 83B1, 83B3 may be located in the center of the plurality of inductors 83.

Accordingly, the vertical cores 808, 809 and the horizontal cores 810, 811 can shield leakage flux that spreads up, down, left and right from the first center inductors 83A2, 83A4 and the second center inductors 83B1, 83B3.

Referring to FIG. 17, the vertical cores 808, 809 and the horizontal cores 810, 811 may surround the sides of each of the plurality of first inductors 83A1, 83A2, 83A3, 83A4 and the sides of each of the plurality of second inductors 83B1, 83B2, 83B3, 83B4.

Accordingly, the vertical cores 808, 809 and the horizontal cores 810, 811 can shield leakage flux that spreads up, down, left and right from the plurality of first inductors 83A1, 83A2, 83A3, 83A4 and the plurality of second inductors 83B1, 83B2, 83B3, 83B4.

Referring again to FIG. 5, the edge of the back cover 60 may be fixed to the frame 50, and the portion of the back cover 60 other than the edge may be spaced apart from the frame 50. In this case, a central portion of the back cover 60 may vibrate more easily than a region adjacent to the edge of the back cover 60.

A vertical line VL may extend in the up-down direction while passing through the center of the frame 50. A horizontal line HL may extend in the left-right directions while passing through the center of the frame 50. The vertical line VL and the horizontal line HL may divide the rear surface of the frame 50 into four areas.

A filter area FA may be an area on the power supply board 71 where the above-described line filters 82, 83 are located. The filter area FA may be adjacent to the lower side of the power supply board 71. The filter area FA may be located in an area adjacent to the left and bottom sides of the frame 50 among the areas on the rear surface of the frame 50.

In this case, compared to the case where the filter area FA is disposed in the central area of the frame 50, the vibration and noise of the back cover 60 caused by the electromagnetic field formed by the line filters 82, 83 can be reduced.

Referring to FIGS. 1 to 17, a display device may include: a display panel; a frame which is located behind the display panel and to which the display panel is coupled; a back cover covering the rear of the frame; a power supply board located between the frame and the back cover and coupled to the frame; a line filter including an inductor and coupled to a rear surface of the power supply board; a housing which provides an internal space where the inductor which is located and is coupled to the power supply board; and a rear core made of a ferrite material coupled to a rear surface of the housing, wherein the rear core may overlap at least a portion of the inductor in the front-rear direction.

The housing may include a plastic material, and the rear core may include: a first sheet made of an aluminum material coupled to the rear surface of the housing; and a second sheet made of a ferrite material that is coupled to the first sheet and spaced apart from the back cover.

The housing may include: a groove formed to be recessed forward from the rear surface of the housing; and an opening formed through the groove and communicating with the internal space of the housing, wherein the rear core may be seated on the groove and cover the opening.

At least a portion of a side surface of the rear core may contact a step formed between the rear surface of the housing and the groove.

The display device may further include a filler which fills the internal space of the housing and which surrounds the inductor, wherein the groove may be located behind the filler.

The housing may penetrate the power supply board, the front of the housing may be spaced rearward from the frame, and the rear surface of the housing may be spaced forward from the back cover.

The display device may further include a gap pad positioned between the rear core and the back cover and coupled to the rear core, wherein the gap pad may be in contact with the back cover.

The frame and the back cover may include a metal material, and the thickness of the rear core may be inversely proportional to the thickness of the frame and the back cover.

The inductor may include: a bobbin made of a plastic material; a wire wound around the bobbin in the form of a coil; and a center core made of a ferrite material that is inserted into the bobbin.

The display device may further include a front core made of a ferrite material coupled to a front surface of the housing, wherein the front core may be spaced rearward from the frame.

The display device may further include: a vertical core including an upper core made of a ferrite material coupled to an upper side of the housing and a lower core made of a ferrite material coupled to a lower side of the housing; and a horizontal core including a left core made of a ferrite material coupled to a left side of the housing and a right core made of a ferrite material coupled to a right side of the housing.

The inductor may further include a plurality of inductors spaced apart from each other, the housing may further include a plurality of housings accommodating the plurality of inductors, and the vertical core and the horizontal core may be located between the plurality of inductors.

The inductor may further include: a plurality of first inductors spaced apart from each other; and a plurality of second inductors spaced apart from each other, wherein first center inductors, which are part of the plurality of first inductors, may be adjacent to the plurality of second inductors, wherein second center inductors, which are part of the plurality of second inductors, may be adjacent to the plurality of first inductors, and the vertical core and the horizontal core may surround lateral sides of each of the first center inductors and lateral sides of each of the second center inductors.

The inductor may further include: a plurality of first inductors spaced apart from each other; and a plurality of second inductors spaced apart from each other, wherein the vertical core and the horizontal core may surround lateral sides of each of the plurality of first inductors and lateral sides of each of the plurality of second inductors.

An edge of the back cover may be fixed to the frame, a portion of the back cover other than the edge may be spaced apart from the frame, and a filter area may be an area on the power supply board where the line filter is located and may be located between a central portion of the back cover and the edge of the back cover.

Certain embodiments or other embodiments of the present disclosure described above are not intended to be exclusive or distinct from each other. The components or functions in certain embodiments or other embodiments of the present disclosure described above may be used in combination or combined. (Certain embodiments or other embodiments of the invention described above are not mutually exclusive or distinct from each other. Any or all elements of the embodiments of the invention described above may be combined or combined with each other in configuration or function)

For example, configuration A described in a particular embodiment and/or drawing may be combined with configuration B described in another embodiments and/or drawing.

In other words, even if the combination between components is not directly explained, it means that combination is possible, except in cases where it is described that combination is impossible. (For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible).

The above detailed description should not be construed as restrictive in any respect and should be considered illustrative. The scope of the present disclosure should be determined by reasonable interpretation of the appended claims, and all changes within the equivalent scope of the present disclosure are included in the scope of the present disclosure. (Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art).

What is claimed is:

1. A display device, comprising:
a display panel;
a frame which is located behind the display panel and to which the display panel is coupled;
a back cover covering a rear of the frame;
a power supply board located between the frame and the back cover and coupled to the frame;
a line filter including an inductor and coupled to a rear surface of the power supply board;
a housing which provides an internal space where the inductor is located and which is coupled to the power supply board; and
a rear core made of a ferrite material coupled to a rear surface of the housing,
wherein the rear core overlaps at least a portion of the inductor in a front-rear direction,
wherein the housing comprises a plastic material, and
wherein the rear core comprises:
a first sheet made of an aluminum material coupled to the rear surface of the housing; and
a second sheet made of a ferrite material that is coupled to the first sheet and spaced apart from the back cover.

2. The display device of claim 1, wherein the housing comprises:
a groove formed to be recessed forward from the rear surface of the housing; and
an opening formed through the groove and communicating with the internal space of the housing, and
wherein the rear core is seated on the groove and covers the opening.

3. The display device of claim 2, wherein at least a portion of a side surface of the rear core contacts a step formed between the rear surface of the housing and the groove.

4. The display device of claim 2, further comprising a filler which fills the internal space of the housing and which surrounds the inductor,
wherein the groove is located behind the filler.

5. A display device, comprising:
a display panel;
a frame which is located behind the display panel and to which the display panel is coupled;
a back cover covering a rear of the frame;
a power supply board located between the frame and the back cover and coupled to the frame;
a line filter including an inductor and coupled to a rear surface of the power supply board;
a housing which provides an internal space where the inductor is located and which is coupled to the power supply board; and
a rear core made of a ferrite material coupled to a rear surface of the housing,
wherein the rear core overlaps at least a portion of the inductor in a front-rear direction,
wherein the housing penetrates the power supply board,
wherein a front surface of the housing is spaced rearward from the frame, and
wherein the rear surface of the housing is spaced forward from the back cover.

6. A display device, comprising:
a display panel;
a frame which is located behind the display panel and to which the display panel is coupled;
a back cover covering a rear of the frame;
a power supply board located between the frame and the back cover and coupled to the frame;
a line filter including an inductor and coupled to a rear surface of the power supply board;
a housing which provides an internal space where the inductor is located and which is coupled to the power supply board;
a rear core made of a ferrite material coupled to a rear surface of the housing; and
a gap pad positioned between the rear core and the back cover and coupled to the rear core, wherein the rear core overlaps at least a portion of the inductor in a front-rear direction, and wherein the gap pad is in contact with the back cover.

7. The display device of claim 1, wherein the frame and the back cover comprise a metal material, and a thickness of the rear core is inversely proportional to a thickness of the frame and the back cover.

8. The display device of claim 1, wherein the inductor comprises:

a bobbin made of a plastic material;

a wire wound around the bobbin in the form of a coil; and a center core made of a ferrite material that is inserted into the bobbin.

9. The display device of claim 1, further comprising a front core made of a ferrite material coupled to a front surface of the housing, wherein the front core is spaced rearward from the frame.

10. The display device of claim 1, further comprising:

a vertical core including an upper core made of a ferrite material coupled to an upper side of the housing and a lower core made of a ferrite material coupled to a lower side of the housing; and a horizontal core including a left core made of a ferrite material coupled to a left side of the housing and a right core made of a ferrite material coupled to a right side of the housing.

11. The display device of claim 10, wherein the inductor comprises a plurality of inductors spaced apart from each other, the housing further comprises a plurality of housings accommodating the plurality of inductors, and the vertical core and the horizontal core are located between the plurality of inductors.

12. The display device of claim 10, wherein the inductor comprises:

a plurality of first inductors spaced apart from each other; and a plurality of second inductors spaced apart from each other, and wherein first center inductors, which are part of the plurality of first inductors, are adjacent to the plurality of second inductors, wherein second center inductors, which are part of the plurality of second inductors, are adjacent to the plurality of first inductors, and wherein the vertical core and the horizontal core surround lateral sides of each of the first center inductors and lateral sides of each of the second center inductors.

13. The display device of claim 10, wherein the inductor comprises:

a plurality of first inductors spaced apart from each other; and a plurality of second inductors spaced apart from each other, and wherein the vertical core and the horizontal core surround lateral sides of each of the plurality of first inductors and lateral sides of each of the plurality of second inductors.

14. The display device of claim 1, wherein an edge of the back cover is fixed to the frame, a portion of the back cover other than the edge is spaced apart from the frame, and a filter area is an area on the power supply board where the line filter is located and is located between a central portion of the back cover and the edge of the back cover.

* * * * *